(12) United States Patent
Yaginuma et al.

(10) Patent No.: US 9,164,213 B2
(45) Date of Patent: Oct. 20, 2015

(54) POLARIZING PLATE AND ORGANIC EL PANEL

(71) Applicant: NITTO DENKO CORPORATION, Ibaraki-shi, Osaka (JP)

(72) Inventors: Hironori Yaginuma, Ibaraki (JP); Takashi Shimizu, Ibaraki (JP); Kazuki Uwada, Ibaraki (JP); Nao Murakami, Ibaraki (JP); Tadashi Kojima, Ibaraki (JP); Kentarou Takeda, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/390,907

(22) PCT Filed: Jun. 18, 2013

(86) PCT No.: PCT/JP2013/066645
§ 371 (c)(1),
(2) Date: Oct. 6, 2014

(87) PCT Pub. No.: WO2013/191152
PCT Pub. Date: Dec. 27, 2013

(65) Prior Publication Data

US 2015/0168624 A1    Jun. 18, 2015

(30) Foreign Application Priority Data

Jun. 21, 2012 (JP) .................................. 2012-139481
Jun. 10, 2013 (JP) .................................. 2013-122175

(51) Int. Cl.
*G02B 5/30* (2006.01)
*H01L 51/52* (2006.01)
*C08G 64/06* (2006.01)

(52) U.S. Cl.
CPC .............. *G02B 5/3083* (2013.01); *C08G 64/06* (2013.01); *G02B 5/3016* (2013.01); *H01L 51/5293* (2013.01)

(58) Field of Classification Search
CPC ............... G02B 5/3083; G02B 5/3016; H01L 51/5293; C08G 64/06

USPC .................. 359/489.07; 313/112; 349/96
See application file for complete search history.

(56) References Cited

U.S. PATENT DOCUMENTS 6,565,974 B1    5/2003    Uchiyama et al.
RE39,753 E      7/2007    Uchiyama et al.

(Continued)

FOREIGN PATENT DOCUMENTS

EP    1930750 A1    6/2008
JP    3325560 B2    9/2002

(Continued)

OTHER PUBLICATIONS

International Search Report dated Aug. 20, 2013 issued in corresponding application No. PCT/JP2013/066645.

(Continued)

*Primary Examiner* — Frank Font
(74) *Attorney, Agent, or Firm* — Westerman, Hattori, Daniels & Adrian, LLP

(57) ABSTRACT

Provided is a polarizing plate that has an excellent viewing angle characteristic and suppresses changes in display characteristics. A polarizing plate of the present invention is used in an organic EL panel, and includes a polarizer (10), a first retardation layer (30), and a second retardation layer (40). The first retardation layer (30) shows a refractive index characteristic of $nx > ny \geq nz$, satisfies a relationship of $Re(450) < Re(550)$, and has a water absorption rate of 3% or less. The second retardation layer (40) shows a refractive index characteristic of $nz > nx \geq ny$. A laminate of the first retardation layer (30) and the second retardation layer (40) has an $Re(550)$ of from 120 nm to 160 nm and an $Rth(550)$ of from 40 nm to 100 nm.

7 Claims, 1 Drawing Sheet

(56) References Cited

U.S. PATENT DOCUMENTS

| | | |
|---|---|---|
| 7,557,883 B2 | 7/2009 | Kawamoto et al. |
| 8,778,486 B2 | 7/2014 | Tanaka et al. |
| 8,836,897 B2* | 9/2014 | Takeda et al. ............... 349/117 |
| 2005/0195348 A1 | 9/2005 | Saitoh et al. |
| 2008/0007680 A1* | 1/2008 | Kitagawa et al. ............ 349/118 |
| 2008/0049179 A1 | 2/2008 | Kawamoto et al. |
| 2008/0151166 A1 | 6/2008 | Takemoto |
| 2008/0174724 A1* | 7/2008 | Nakayama et al. ............ 349/96 |
| 2009/0161045 A1* | 6/2009 | Kawamoto et al. ............ 349/98 |
| 2009/0180059 A1* | 7/2009 | Fukuda et al. ................ 349/96 |
| 2010/0271574 A1* | 10/2010 | Ikeda et al. .................... 349/96 |
| 2012/0231255 A1 | 9/2012 | Tanaka et al. |
| 2012/0262651 A1* | 10/2012 | Takeda et al. ................. 349/96 |
| 2012/0308796 A1 | 12/2012 | Tanaka et al. |
| 2013/0003000 A1* | 1/2013 | Nakayama et al. .......... 349/117 |
| 2014/0268334 A1 | 9/2014 | Tanaka et al. |

FOREIGN PATENT DOCUMENTS

| | | |
|---|---|---|
| JP | 2004-226842 A | 8/2004 |
| JP | 2008-181091 A | 8/2008 |
| JP | 2011-128389 A | 6/2011 |
| JP | 2012-31369 A | 2/2012 |
| TW | 200811492 | 3/2008 |
| TW | 200946989 A | 11/2009 |
| TW | 201144869 A1 | 12/2011 |
| WO | 2011/062163 A1 | 5/2011 |
| WO | 2011/062239 A1 | 5/2011 |

OTHER PUBLICATIONS

Request for an accelerated examination dated Dec. 3, 2013 issued in corresponding application No. JP2013-122175.

Taiwanese Office Action dated Aug. 14, 2014, issued in corresponding application No. TW102122252.

English translation of Taiwanese Office Action dated Aug. 14, 2014, issued in corresponding TW patent application No. 102122252 (3 pages).

English translation of Japanese Request for an Accelerated Examination dated Dec. 3, 2013, in corresponding JP patent application No. 2013-122175 (5 pages).

Extended European Search Report dated Mar. 4, 2015, issued in corresponding European Application No. 13807678.1. (4 pages).

Notification of Argument Submission dated Mar. 27, 2015, issued in corresponding Korean Patent Application No. 10-2014-7031093 with English translation (13 pages).

Office Action dated May 6, 2015, issued in counterpart Chinese Patent Application No. 201380029874.3, w/English translation (10 pages).

* cited by examiner (a) 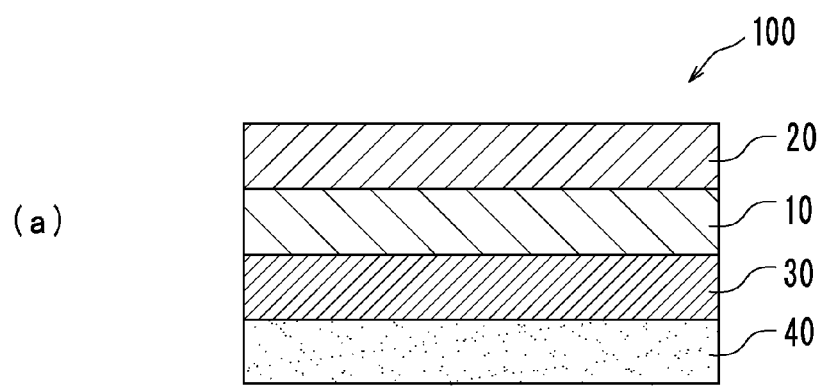
(b) 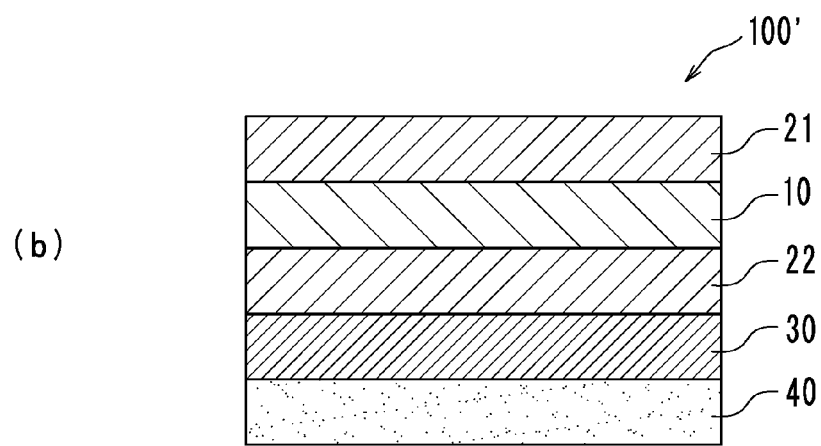

POLARIZING PLATE AND ORGANIC EL PANEL

TECHNICAL FIELD

The present invention relates to a polarizing plate and an organic EL panel.

BACKGROUND ART

In recent years, a display mounted with an organic EL panel has been proposed in association with widespread use of a thin display. The organic EL panel is liable to cause problems such as ambient light reflection and background reflection because the panel includes a metal layer having high reflectivity. In view of the foregoing, it has been known that those problems are prevented by providing a circularly polarizing plate on a viewer side. A product obtained by laminating a retardation film typified by a cycloolefin (COP)-based resin film (typically a λ/4 plate) so that its slow axis may form an angle of about 45° with respect to an absorption axis of a polarizer has been known as a general circularly polarizing plate. The retardation film made of a COP-based resin is known to have the so-called flat wavelength dispersion characteristic. That is, its retardation value is independent of a wavelength of measuring light and substantially constant. When a circularly polarizing plate including a retardation film having such flat wavelength dispersion characteristic is used in the organic EL panel, a problem in that an excellent reflection hue is not obtained arises.

To solve such problem as described above, a circularly polarizing plate including a retardation film having the so-called reverse wavelength dispersion dependency (reverse wavelength dispersion characteristic) has been proposed (for example, Patent Literature 1). That is, the retardation value of the film increases depending on the wavelength of measuring light. When such circularly polarizing plate is used in the organic EL panel, ambient light reflection in a front direction can be significantly alleviated, and a reflection hue in the direction can be significantly improved. However, when the panel is viewed from an oblique direction, a hue different from the hue in the front direction is obtained and the hue difference has been a serious problem. A problem in that display characteristics of the panel change over time has also been confirmed.

CITATION LIST

Patent Literature

[PTL 1] JP 3325560 B2

SUMMARY OF INVENTION

Technical Problem

The present invention has been made to solve the problems in the related art, and a main object of the present invention is to provide a polarizing plate that has an excellent viewing angle characteristic and suppresses changes in display characteristics.

Means for Solving the Problems

According to one aspect of the present invention, a polarizing plate is provided. The polarizing plate is used in an organic EL panel. The polarizing plate includes a polarizer, a first retardation layer and a second retardation layer. The first retardation layer shows a refractive index characteristic of $nx>ny \geq nz$ and satisfies a relationship of $Re(450)<Re(550)$. The second retardation layer shows a refractive index characteristic of $nz>nx \geq ny$. A laminate of the first retardation layer and the second retardation layer has an Re(550) of from 120 nm to 160 nm and an Rth(550) of from 40 nm to 100 nm. The first retardation layer has a water absorption rate of 3% or less.

In one embodiment of the invention, the polarizing plate is free of an optically anisotropic layer between the polarizer and the first retardation layer or the second retardation layer.

In another embodiment of the invention, the first retardation layer is formed of a polycarbonate resin including a structural unit derived from a dihydroxy compound represented by the following general formula (1):

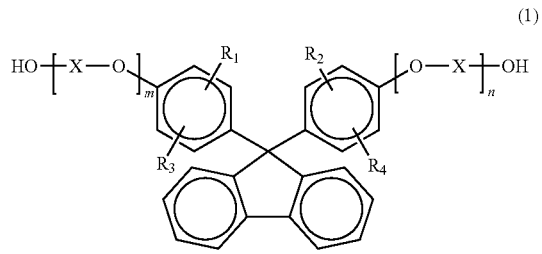

in the general formula (1), $R_1$ to $R_4$ each independently represent a hydrogen atom, a substituted or unsubstituted alkyl group having 1 to 20 carbon atoms, a substituted or unsubstituted cycloalkyl group having 6 to 20 carbon atoms, or a substituted or unsubstituted aryl group having 6 to 20 carbon atoms, X represents a substituted or unsubstituted alkylene group having 2 to 10 carbon atoms, a substituted or unsubstituted cycloalkylene group having 6 to 20 carbon atoms, or a substituted or unsubstituted arylene group having 6 to 20 carbon atoms, and m and n each independently represent an integer of from 0 to 5.

In still another embodiment of the invention, the first retardation layer is formed of a polycarbonate resin including a structural unit derived from a dihydroxy compound represented by the following general formula (2).

In still another embodiment of the invention, the first retardation layer is formed of a polycarbonate resin including a structural unit derived from a dihydroxy compound represented by the following general formula (5):

in the general formula (5), $R_7$ represents a substituted or unsubstituted alkylene group having 2 to 10 carbon atoms, and p represents an integer of from 2 to 100.

In still another embodiment of the invention, the first retardation layer includes a retardation film obtained by oblique stretching.

According to another aspect of the invention, an organic EL panel is provided. The organic EL panel includes the polarizing plate.

Advantageous Effects of Invention

According to one embodiment of the present invention, the viewing angle characteristic can be improved and the changes in display characteristics can be suppressed by using the first retardation layer and second retardation layer satisfying the optical characteristics and water absorption rate.

BRIEF DESCRIPTION OF DRAWINGS

FIG. 1(a) is a schematic sectional view of a polarizing plate according to a preferred embodiment of the present invention and FIG. 1(b) is a schematic sectional view of a polarizing plate according to another preferred embodiment of the present invention.

DESCRIPTION OF EMBODIMENTS

Hereinafter, preferred embodiments of the present invention are described. However, the present invention is not limited to these embodiments.
(Definitions of terms and symbols)
The definitions of terms and symbols used herein areas follows.
(1) Refractive Indices (Nx, Ny, and Nz)
A symbol nx represents a refractive index in a direction in which an in-plane refractive index is maximum (that is, slow axis direction), ny represents a refractive index in a direction perpendicular to the slow axis in the plane, and nz represents a refractive index in a thickness direction.
(2) In-Plane Retardation (Re)
The term "Re(550)" refers to an in-plane retardation measured at 23° C. with light having a wavelength of 550 nm. The Re(550) is determined from the equation "Re=(nx−ny)×d" when the thickness of a layer (film) is represented by d (nm). It should be noted that the term "Re(450)" refers to an in-plane retardation measured at 23° C. with light having a wavelength of 450 nm.
(3) Thickness Direction Retardation (Rth)
The term "Rth(550)" refers to a thickness direction retardation measured at 23° C. with light having a wavelength of 550 nm. The Rth(550) is determined from the equation "Rth=(nx−nz)×d" when the thickness of a layer (film) is represented by d (nm). It should be noted that the term "Rth(450)" refers to a thickness direction retardation measured at 23° C. with light having a wavelength of 450 nm.
(4) Nz Coefficient
An Nz coefficient is determined from the equation "Nz=Rth/Re".

A. Polarizing Plate

A polarizing plate of the present invention includes a polarizer, a first retardation layer, and a second retardation layer, and the first retardation layer and the second retardation layer are laminated on one side of the polarizer. The polarizing plate is preferably free of an optically anisotropic layer (such as a liquid crystal layer or a retardation film) between the polarizer and the first retardation layer or the second retardation layer. Hereinafter, a specific example thereof is described.

FIG. 1(a) is a schematic sectional view of a polarizing plate according to a preferred embodiment of the present invention. A polarizing plate 100 according to this embodiment includes a polarizer 10, a protective film 20 arranged on one side of the polarizer 10, and a first retardation layer 30 and second retardation layer 40 arranged on the other side of the polarizer 10. Although the first retardation layer 30 is arranged closer to a polarizer 10 side than the second retardation layer 40 in the illustrated example, the second retardation layer 40 may be arranged on the polarizer 10 side. In this embodiment, the first retardation layer 30 (the second retardation layer 40) can also function as a protective layer for the polarizer 10. In addition, when the polarizer and the first retardation layer (the second retardation layer) are directly attached to each other as described above, an additionally excellent reflection hue (especially a viewing angle characteristic) can be achieved and changes in display characteristics can be suppressed.

FIG. 1(b) is a schematic sectional view of a polarizing plate according to another preferred embodiment of the present invention. A polarizing plate 100' includes the polarizer 10, a first protective film 21 arranged on one side of the polarizer 10, the first retardation layer 30 and second retardation layer 40 arranged on the other side of the polarizer 10, and a second protective film 22 arranged between the polarizer 10 and the first retardation layer 30. It is preferred that the second protective film 22 be optically isotropic. When the second protective film is optically isotropic, an additionally excellent reflection hue (especially a viewing angle characteristic) can be achieved. Although the first retardation layer 30 is arranged closer to the polarizer 10 side than the second retardation layer 40 in the illustrated example, the second retardation layer 40 may be arranged on the polarizer 10 side.

The refractive index characteristic of the first retardation layer 30 shows a relationship of nx>ny≥nz, and the layer has a slow axis. The polarizer 10 and the first retardation layer 30 are laminated so that the absorption axis of the polarizer 10 and the slow axis of the first retardation layer 30 may form a predetermined angle. An angle θ formed between the absorption axis of the polarizer 10 and the slow axis of the first retardation layer 30 satisfies a relationship of preferably 35°≤θ≤55°, more preferably 38°≤θ≤52°, still more preferably 39°≤θ≤51°. When the angle deviates from the range, a front reflectance increases and hence the antireflection function of the polarizing plate cannot be sufficiently obtained.

A-1. Polarizer

Any appropriate polarizer may be adopted as the polarizer. Specific examples thereof include: a product obtained by subjecting a hydrophilic polymer film such as a polyvinyl alcohol-based film, a partially formalized polyvinyl alcohol-based film, or an ethylene-vinyl acetate copolymer-based partially saponified film to dyeing treatment with a dichromatic substance such as iodine or a dichromatic dye and stretching treatment; and a polyene-based alignment film such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the film is preferably used because of its excellent optical characteristics.

The dyeing with iodine is performed by, for example, immersing the polyvinyl alcohol-based film in an aqueous solution of iodine. The stretching ratio of the uniaxial stretching is preferably from 3 to 7 times. The stretching may be performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like.

The thickness of the polarizer is typically from about 1 μm to 80 μm.

A-2. First Retardation Layer

As described above, the refractive index characteristic of the first retardation layer shows a relationship of nx>ny≥nz. The in-plane retardation Re(550) of the first retardation layer is preferably from 80 nm to 200 nm, more preferably from 100 nm to 180 nm, still more preferably from 110 nm to 170 nm.

The first retardation layer shows the so-called reverse wavelength dispersion dependency. Specifically, its in-plane retardations satisfy a relationship of Re(450)<Re(550). An excellent reflection hue can be achieved by satisfying such relationship. A ratio "Re(450)/Re(550)" is preferably 0.8 or more and less than 1, more preferably 0.8 or more and 0.95 or less.

The Nz coefficient of the first retardation layer is preferably from 1 to 3, more preferably from 1 to 2.5, still more preferably from 1 to 1.5, particularly preferably from 1 to 1.3. An additionally excellent reflection hue can be achieved by satisfying such relationship.

The water absorption rate of the first retardation layer is 3% or less, preferably 2.5% or less, more preferably 2% or less. Changes in display characteristics over time can be suppressed by satisfying such water absorption rate. It should be noted that the water absorption rate can be determined in conformity with JIS K 7209.

The first retardation layer is typically a retardation film formed of any appropriate resin. A polycarbonate resin is preferably used as the resin for forming the retardation film.

In a preferred embodiment, the polycarbonate resin includes a structural unit derived from a dihydroxy compound represented by the following general formula (1), a structural unit derived from a dihydroxy compound represented by the following general formula (2), and structural units derived from one or more kinds of dihydroxy compounds selected from the group consisting of a dihydroxy compound represented by the following general formula (3), a dihydroxy compound represented by the following general formula (4), a dihydroxy compound represented by the following general formula (5), and a dihydroxy compound represented by the following general formula (6).

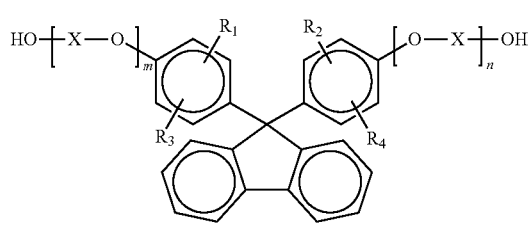

(1)

(In the general formula (1), $R_1$ to $R_4$ each independently represent a hydrogen atom, a substituted or unsubstituted alkyl group having 1 to 20 carbon atoms, a substituted or unsubstituted cycloalkyl group having 6 to 20 carbon atoms, or a substituted or unsubstituted aryl group having 6 to 20 carbon atoms, X represents a substituted or unsubstituted alkylene group having 2 to 10 carbon atoms, a substituted or unsubstituted cycloalkylene group having 6 to 20 carbon atoms, or a substituted or unsubstituted arylene group having 6 to 20 carbon atoms, and m and n each independently represent an integer of from 0 to 5.)

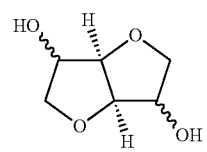

(2)

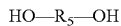

(3)

(In the general formula (3), $R_5$ represents a substituted or unsubstituted cycloalkylene group of a monocyclic structure having 4 to 20 carbon atoms.)

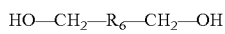

(4)

(In the general formula (4), $R_6$ represents a substituted or unsubstituted cycloalkylene group of a monocyclic structure having 4 to 20 carbon atoms.)

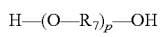

(5)

(In the general formula (5), $R_7$ represents a substituted or unsubstituted alkylene group having 2 to 10 carbon atoms, and p represents an integer of from 2 to 100.)

(6)

(In the general formula (6), $R_{11}$ represents an alkyl group having 2 to 20 carbon atoms or a group represented by the following formula (7).)

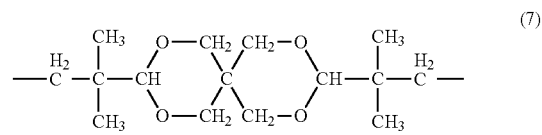

(7)

<Dihydroxy Compound Represented by the General Formula (1)>

Specific examples of the dihydroxy compound represented by the general formula (1) include 9,9-bis(4-hydroxyphenyl)fluorene, 9,9-bis(4-hydroxy-3-methylphenyl)fluorene, 9,9-bis(4-hydroxy-3-ethylphenyl)fluorene, 9,9-bis(4-hydroxy-3-n-propylphenyl)fluorene, 9,9-bis(4-hydroxy-3-isopropylphenyl)fluorene, 9,9-bis(4-hydroxy-3-n-butylphenyl)fluorene, 9,9-bis(4-hydroxy-3-sec-butylphenyl)fluorene, 9,9-bis(4-hydroxy-3-tert-propylphenyl)fluorene, 9,9-bis(4-hydroxy-3-cyclohexylphenyl)fluorene, 9,9-bis(4-hydroxy-3-phenylphenyl)fluorene, 9,9-bis(4-(2-hydroxyethoxyl)phenyl)fluorene, 9,9-bis(4-(2-hydroxyethoxy)-3-methylphenyl)fluorene, 9,9-bis(4-(2-hydroxyethoxy)-3-isopropylphenyl)fluorene, 9,9-bis(4-(2-hydroxyethoxy)-3-isobutylphenyl)fluorene, 9,9-bis(4-(2-hydroxyethoxy)-3-tert-butylphenyl)fluorene, 9,9-bis(4-(2-hydroxyethoxy)-3-cyclohexylphenyl)fluorene, 9,9-bis(4-(2-hydroxyethoxy)-3-phenylphenyl)fluorene, 9,9-bis(4-(2-hydroxyethoxy)-3,5-dimethylphenyl)fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene. Of those, 9,9-bis(4-hydroxy-3-methylphenyl)fluorene, 9,9-bis(4-(2-hydroxyethoxyl)phenyl)fluorene, and 9,9-bis(4-(2-hydroxyethoxy)-3-methylphenyl)fluorene are preferred, and 9,9-bis(4-(2-hydroxyethoxyl)phenyl)fluorene is particularly preferred.

<Dihydroxy Compound Represented by the General Formula (2)>

Examples of the dihydroxy compound represented by the general formula (2) include isosorbide, isomannide, and isoidet in a stereoisomeric relationship. One kind of those compounds may be used alone, or two or more kinds thereof may be used in combination. Of those dihydroxy compounds, isosorbide obtained by subjecting sorbitol produced from various kinds of starch abundantly present as resources and easily available to dehydration condensation is most preferred in terms of ease of availability, ease of production, optical characteristics, and formability.

<Dihydroxy Compound Represented by the General Formula (3)>

The dihydroxy compound represented by the general formula (3) is, for example, a compound including a cycloalkylene group of a monocyclic structure (alicyclic dihydroxy compound). Adopting the monocyclic structure can improve toughness when the polycarbonate resin to be obtained is turned into a film. Typical examples of the alicyclic dihydroxy compound include compounds each including a five-membered ring structure or a six-membered ring structure. Adopting the five-membered ring structure or the six-membered ring structure can improve the heat resistance of the polycarbonate resin to be obtained. The six-membered ring structure may be fixed by a covalent bond in a chair form or a boat form. Specific examples thereof include 1,2-cyclopentanediol, 1,3-cyclopentanediol, 1,2-cyclohexanediol, 1,3-cyclohexanediol, 1,4-cyclohexanediol, and 2-methyl-1,4-cyclohexanediol. One kind of the dihydroxy compounds each represented by the general formula (3) may be used alone, or two or more kinds thereof may be used in combination.

<Dihydroxy Compound Represented by the General Formula (4)>

The dihydroxy compound represented by the general formula (4) is, for example, a compound including a cycloalkylene group of a monocyclic structure (alicyclic dihydroxy compound). Adopting the monocyclic structure can improve toughness when the polycarbonate resin to be obtained is turned into a film. Typical examples of the alicyclic dihydroxy compound include various isomers in each of which $R_6$ in the general formula (4) is represented by the following general formula (Ia) (where $R^3$ represents a hydrogen atom, or a substituted or unsubstituted alkyl group having 1 to 12 carbon atoms). Preferred specific examples of such isomers include 1,2-cyclohexanedimethanol, 1,3-cyclohexanedimethanol, and 1,4-cyclohexanedimethanol. Those compounds are easily available and excellent in handleability. One kind of the dihydroxy compounds each represented by the general formula (4) may be used alone, or two or more kinds thereof may be used in combination.

(Ia)

It should be noted that the compounds exemplified in the foregoing with regard to the dihydroxy compounds represented by the general formulae (3) and (4) are each merely an example of the alicyclic dihydroxy compound that may be used, and the dihydroxy compounds represented by the general formulae (3) and (4) are by no means limited thereto.

<Dihydroxy Compound Represented by the General Formula (5)>

Specific examples of the dihydroxy compound represented by the general formula (5) include diethylene glycol, triethylene glycol, and polyethylene glycol (molecular weight: 150 to 2,000).

<Dihydroxy Compound Represented by the General Formula (6)>

Specific examples of the dihydroxy compound represented by the general formula (6) include ethylene glycol, propylene glycol, 1,4-butanediol, 1,6-hexanediol, and spiroglycol represented by the following formula (8). Of those, propylene glycol, 1,4-butanediol, and spiroglycol are preferred.

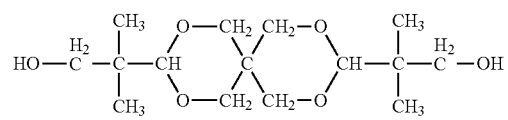

(8)

Of the structural unit derived from the dihydroxy compound represented by the general formula (3), the structural unit derived from the dihydroxy compound represented by the general formula (4), the structural unit derived from the dihydroxy compound represented by the general formula (5), and the structural unit derived from the dihydroxy compound represented by the general formula (6), the structural unit derived from the dihydroxy compound represented by the general formula (4) and/or the structural unit derived from the dihydroxy compound represented by the general formula (5) are/is preferably incorporated, and the structural unit derived from the dihydroxy compound represented by the general formula (5) is more preferably incorporated. When the resin includes the structural unit derived from the dihydroxy compound represented by the general formula (5), its stretchability can be improved.

The polycarbonate resin according to this embodiment may further include a structural unit derived from any other dihydroxy compound.

<Other Dihydroxy Compound>

An example of the other dihydroxy compound is a bisphenol.

Examples of the bisphenol include 2,2-bis(4-hydroxyphenyl)propane [=bisphenol A], 2,2-bis(4-hydroxy-3,5-dimethylphenyl)propane, 2,2-bis(4-hydroxy-3,5-diethylphenyl)propane, 2,2-bis(4-hydroxy-(3,5-diphenyl)phenyl)propane, 2,2-bis(4-hydroxy-3,5-dibromophenyl)propane, 2,2-bis(4-hydroxyphenyl)pentane, 2,4'-dihydroxy-diphenylmethane, bis(4-hydroxyphenyl)methane, bis(4-hydroxy-5-nitrophenyl)methane, 1,1-bis(4-hydroxyphenyl)ethane, 3,3-bis(4-hydroxyphenyl)pentane, 1,1-bis(4-hydroxyphenyl)cyclohexane, bis(4-hydroxyphenyl) sulfone, 2,4'-dihydroxydiphenyl sulfone, bis(4-hydroxyphenyl) sulfide, 4,4'-dihydroxydiphenyl ether, 4,4'-dihydroxy-3,3'-dichlorodiphenyl ether, and 4,4'-dihydroxy-2,5-diethoxydiphenyl ether.

The content of the structural unit derived from the dihydroxy compound represented by the general formula (1) in the polycarbonate resin is 18 mol % or more, preferably 20 mol % or more, more preferably 25 mol % or more. When the content of the structural unit is excessively small, reverse wavelength dispersion dependency may not be obtained.

The content of the structural units derived from one or more kinds of dihydroxy compounds selected from the group consisting of the dihydroxy compound represented by the general formula (3), the dihydroxy compound represented by the general formula (4), the dihydroxy compound represented by the general formula (5), and the dihydroxy compound represented by the general formula (6) in the polycarbonate resin is preferably 25 mol % or more, more preferably 30 mol % or more, still more preferably 35 mol % or more. When the content of the structural units is excessively small, toughness when the resin is turned into a film may be poor.

The glass transition temperature of the polycarbonate resin is preferably 110° C. or more and 150° C. or less, more preferably 120° C. or more and 140° C. or less. When the glass transition temperature is excessively low, the heat resistance of the resin tends to deteriorate and hence the resin may cause a dimensional change after its forming into a film. In addition, the image quality of an organic EL panel to be obtained may reduce. When the glass transition temperature is excessively high, the forming stability of the resin at the time of its forming into a film may deteriorate. In addition, the transparency of the film may be impaired. It should be noted that the glass transition temperature is determined in conformity with JIS K 7121 (1987).

The molecular weight of the polycarbonate resin can be represented by a reduced viscosity. The reduced viscosity is measured as follows: a solution of the resin is prepared by using methylene chloride as a solvent while precisely adjusting a polycarbonate concentration to 0.6 g/dL, and the reduced viscosity of the solution is measured with an Ubbelohde viscosity tube at a temperature of 20.0° C.±0.1° C. In ordinary cases, a lower limit for the reduced viscosity is preferably 0.30 dL/g, more preferably 0.35 dL/g or more. In ordinary cases, an upper limit for the reduced viscosity is preferably 1.20 dL/g, more preferably 1.00 dL/g, still more preferably 0.80 dL/g. When the reduced viscosity is less than the lower limit, a problem in that the mechanical strength of a molded article reduces may arise. On the other hand, when the reduced viscosity is more than the upper limit, a problem in that the flowability of the resin upon its forming reduces, and hence productivity or formability reduces may arise.

The retardation film is typically produced by stretching a resin film in at least one direction.

Any appropriate method may be adopted as a method of forming the resin film. Examples thereof include a melt extrusion method (such as a T die molding method), a cast coating method (such as a casting method), a calendar molding method, a hot press method, a co-extrusion method, a co-melting method, multilayer extrusion, and an inflation molding method. Of those, a T die molding method, a casting method, and an inflation molding method are preferably used.

The thickness of the resin film (unstretched film) may be set to any appropriate value depending on, for example, desired optical characteristics and stretching conditions to be described later. The thickness is preferably from 50 μm to 300 μm.

Any appropriate stretching method and stretching conditions (such as a stretching temperature, a stretching ratio, and a stretching direction) may be adopted for the stretching. Specifically, one kind of various stretching methods such as free-end stretching, fixed-end stretching, free-end shrinkage, and fixed-end shrinkage can be employed alone, or two or more kinds thereof can be employed simultaneously or sequentially. With regard to the stretching direction, the stretching can be performed in various directions or dimensions such as a horizontal direction, a vertical direction, a thickness direction, and a diagonal direction. When the glass transition temperature of the resin film is represented by Tg, the stretching temperature ranges preferably from Tg−30° C. to Tg+60° C., more preferably from Tg−10° C. to Tg+50° C.

A retardation film having the desired optical characteristics (such as a refractive index characteristic, an in-plane retardation, and an Nz coefficient) can be obtained by appropriately selecting the stretching method and stretching conditions.

In one embodiment, the retardation film is produced by subjecting the resin film to uniaxial stretching or fixed-end uniaxial stretching. The fixed-end uniaxial stretching is specifically, for example, a method involving stretching the resin film in its widthwise direction (lateral direction) while running the film in its lengthwise direction. The stretching ratio is preferably from 1.1 times to 3.5 times.

In another embodiment, the retardation film is produced by obliquely stretching a resin film having an elongate shape in a direction at the angle θ with respect to its lengthwise direction in a continuous manner. Adopting the oblique stretching provides a stretched film having an elongate shape with an alignment angle of the angle θ (a slow axis in the direction at the angle θ) with respect to the lengthwise direction of the film, enables a roll-to-roll process upon, for example, its lamination with the polarizer, and can simplify a production process.

A stretching machine to be used in the oblique stretching is, for example, a tenter-type stretching machine capable of applying a feeding force or tensile force, or take-up force having different speeds on left and right sides in a lateral direction and/or a longitudinal direction. Although the tenter-type stretching machine comes in, for example, a lateral uniaxial stretching machine and a simultaneous biaxial stretching machine, any appropriate stretching machine may be used as long as the machine can obliquely stretch the resin film having an elongate shape in a continuous manner.

The thickness of the retardation film (stretched film) is preferably from 20 μm to 100 μm, more preferably from 30 μm to 80 μm, still more preferably from 30 μm to 65 μm.

A-3. Second Retardation Layer

As described above, the refractive index characteristic of the second retardation layer 40 shows a relationship of nz>nx≥ny.

The thickness direction retardation Rth(550) of the second retardation layer is preferably from −260 nm to −10 nm, more preferably from −230 nm to −15 nm, still more preferably from −215 nm to −20 nm.

In one embodiment, the refractive indices of the second retardation layer show a relationship of nx=ny. Herein, the term "nx=ny" encompasses not only the case where the nx and the ny are strictly equal to each other but also the case where the nx and the ny are substantially equal to each other. Specifically, the term means that the Re(550) of the layer is less than 10 nm. In another embodiment, the refractive indices of the second retardation layer show a relationship of nx>ny. In this case, the in-plane retardation Re(550) of the second retardation layer is preferably from 10 nm to 150 nm, more preferably from 10 nm to 80 nm.

The second retardation layer may be formed of any appropriate material. The layer is preferably a liquid crystal layer fixed in homeotropic alignment. A liquid crystal material (liquid crystal compound) that can be subjected to homeotropic alignment may be a liquid crystal monomer or may be a liquid crystal polymer.

Specific examples of the liquid crystal compound and a method of forming the liquid crystal layer include a liquid crystal compound and forming method described in paragraphs [0020] to [0042] of JP 2002-333642 A. In this case, the thickness of the layer is preferably from 0.1 μm to 5 μm, more preferably from 0.2 μm to 3 μm.

As another preferred specific example, the second retardation layer may be a retardation film formed of a fumaric acid diester-based resin described in JP 2012-32784 A. In this case, the thickness of the layer is preferably from 5 μm to 50 μm, more preferably from 10 μm to 35 μm.

A-4. Laminate

The in-plane retardation Re(550) of a laminate of the first retardation layer and the second retardation layer is from 120 nm to 160 nm, preferably from 130 nm to 150 nm. The thickness direction retardation Rth(550) of the laminate is from 40 nm to 100 nm, preferably from 60 nm to 80 nm. Setting the optical characteristics of the laminate as described above can improve a viewing angle characteristic and suppress changes in display characteristics. It should be noted that the laminate is obtained by laminating the first retardation layer and the second retardation layer through any appropriate pressure-sensitive adhesive layer or adhesive layer.

A-5. Protective Film

The protective film is formed of any appropriate film that may be used as a protective layer for the polarizer. Specific examples of a material serving as a main component of the film include transparent resins such as a cellulose-based resin such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth)acrylic resin, and an acetate-based resin. Another example thereof is a thermosetting resin or a UV-curable resin such as a (meth)acrylic resin, a urethane-based resin, a (meth)acrylic urethane-based resin, an epoxy-based resin, or a silicone-based resin. Still another example thereof is a glassy polymer such as a siloxane-based polymer. Further, a polymer film described in JP 2001-343529 A (WO 01/37007 A1) may also be used. As a material for the film, for example, there may be used a resin composition containing a thermoplastic resin having a substituted or unsubstituted imide group in a side chain and a thermoplastic resin having a substituted or unsubstituted phenyl group and a nitrile group in a side chain. An example thereof is a resin composition containing an alternate copolymer formed of isobutene and N-methylmaleimide and an acrylonitrile-styrene copolymer. The polymer film may be an extruded product of the resin composition, for example.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit for the Tg of the (meth)acrylic resin is not particularly limited, but is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates such as poly(methyl methacrylate), a methyl methacrylate-(meth)acrylic acid copolymer, a methyl methacrylate-(meth)acrylate copolymer, a methyl methacrylate-acrylate-(meth)acrylic acid copolymer, a methyl (meth)acrylate-styrene copolymer (such as an MS resin), and a polymer having an alicyclic hydrocarbon group (such as a methyl methacrylate-cyclohexyl methacrylate copolymer or a methyl methacrylate-norbornyl (meth)acrylate copolymer). Preferred examples thereof include poly ($C_{1-6}$ alkyl (meth)acrylates) such as polymethyl(meth)acrylate. A more preferred example thereof is a methyl methacrylate-based resin containing methyl methacrylate as a main component (from 50 to 100 wt %, preferably from 70 to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule described in JP 2004-70296 A, and a (meth)acrylic resin with a high Tg obtained by intramolecular cross-linking or an intramolecular cyclization reaction.

The (meth)acrylic resin is particularly preferably a (meth)acrylic resin having a lactone ring structure because of having high heat resistance, high transparency, and high mechanical strength.

Examples of the (meth)acrylic resin having a lactone ring structure include (meth)acrylic resins each having a lactone ring structure described in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, and most preferably 140° C. or more because excellent durability can be obtained. An upper limit value for the Tg of the (meth)acrylic resin having a lactone ring structure is not particularly limited, but is preferably 170° C. or less from the viewpoint of formability or the like.

It should be noted that the term "(meth)acrylic" as used herein refers to acrylic and/or methacrylic.

The protective film 20 (first protective film 21) to be arranged on an opposite side to the retardation layers with respect to the polarizer may be subjected to surface treatment such as hard coat treatment, antireflection treatment, sticking prevention treatment, or antiglare treatment as required. The thickness of the protective film (first protective film) is typically 5 mm or less, preferably 1 mm or less, more preferably from 1 μm to 500 μm, still more preferably from 5 μm to 150 μm.

As described above, it is preferred that the second protective film 22 to be arranged between the polarizer 10 and the first retardation layer 30 be optically isotropic. The phrase "optically isotropic" as used herein means that the in-plane retardation Re(550) of the film is from 0 nm to 10 nm and the thickness direction retardation Rth(550) thereof is from −10 nm to +10 nm. In addition, the optically anisotropic layer refers to, for example, a layer having an in-plane retardation Re(550) of more than 10 nm and/or a thickness direction retardation Rth(550) of less than −10 nm or more than 10 nm.

The thickness of the second protective film is preferably from 5 μm to 200 μm, more preferably from 10 μm to 100 μm, still more preferably from 15 μm to 95 μm.

A-6. Others

Any appropriate pressure-sensitive adhesive layer or adhesive layer is used in the lamination of the respective layers for forming the polarizing plate of the present invention. The pressure-sensitive adhesive layer is typically formed of an acrylic pressure-sensitive adhesive. The adhesive layer is typically formed of a polyvinyl alcohol-based adhesive.

Although not shown, a pressure-sensitive adhesive layer may be formed on the polarizing plate 100, 100' on the second retardation layer 40 side. When the pressure-sensitive adhesive layer is formed in advance, the polarizing plate can be easily bonded to any other optical member (such as an organic EL panel). It should be noted that a release film is preferably attached to the surface of the pressure-sensitive adhesive layer until the layer is used.

B. Production Method

Any appropriate method may be adopted as a method of producing the polarizing plate. In one preferred embodiment, the polarizing plate is produced by a method including the steps of: laminating a polarizer having an elongate shape and having an absorption axis in its lengthwise direction, and a first or second retardation layer having an elongate shape so that the lengthwise direction of the polarizer and the lengthwise direction of the retardation layer may be aligned with each other while conveying the polarizer and the retardation layer in the respective lengthwise directions to provide a laminated film; and laminating the laminated film and the second or first retardation layer having an elongate shape so that the lengthwise direction of the laminated film and the lengthwise direction of the retardation layer may be aligned with each other while conveying the laminated film and the retardation layer in the respective lengthwise directions. It should be noted that the polarizing plate may be produced by: laminating the first retardation layer having an elongate shape and the second retardation layer having an elongate shape to produce a laminated retardation film; and laminating the laminated retardation film and the polarizer having an elongate shape. Herein, as described above, the angle θ formed between the absorption axis of the polarizer 10 and the slow axis of the first retardation layer 30 satisfies a relationship of preferably 35°≤θ≤55°, more preferably 38°≤θ≤52°, still more preferably 39°≤θ≤51°.

The first retardation layer having an elongate shape has a slow axis in the direction at the angle θ with respect to its lengthwise direction. According to such construction, as described above, a roll-to-roll process can be performed in the production of the polarizing plate, and a production process can be markedly shortened.

C. Organic EL Panel

An organic EL panel of the present invention includes the polarizing plate on its viewer side. The polarizing plate is laminated so that each retardation layer may be on an organic EL panel side (the polarizer may be on the viewer side).

EXAMPLES

Hereinafter, the present invention is specifically described by way of Examples. However, the present invention is not limited by Examples. It should be noted that methods of measuring characteristics are as described below.

(1) Thickness

Measurement was performed with a dial gauge (manufactured by PEACOCK, product name "DG-205", a dial gauge stand (product name "pds-2")).

(2) Retardation

A sample measuring 50 mm by 50 mm was cut out of each retardation layer, and measurement was performed by using the measurement sample and Axoscan manufactured by Axometrics. Measurement wavelengths were 450 nm and 550 nm, and a measurement temperature was 23° C.

In addition, the average refractive index of the sample was measured with an Abbe refractometer manufactured by ATAGO CO., LTD., and its refractive indices nx, ny, and nz were calculated from the resultant retardation value.

(3) Retardation Fluctuation by Environmental Test

A sample measuring 50 mm by 50 mm was cut out of a retardation film and its retardation was measured with Axoscan. After that, the sample was left at rest in a thermo-hygrostat at 40° C. and 90% RH for 100 hours, and then its retardation was measured. An evaluation was performed by determining a difference between the retardations before and after an environmental test.

(4) Water Absorption Rate

Measurement was performed in conformity with the "method of testing plastic for its water absorption rate and boiling water absorption rate" described in JIS K 7209. A test piece was a square 50 mm on a side, and the test piece was immersed in water having a water temperature of 25° C. for 24 hours. After that, its water absorption rate was determined by measuring a change in its weight after the water immersion as compared to that before the water immersion. The water absorption rate is represented in a % unit.

(5) Reflection Hue

The resultant organic EL panel was caused to display a black image and its reflection hue was measured with a viewing angle-measuring/evaluating apparatus CONOSCOPE manufactured by Auoronic-MELCHERS.

Example 1

(Production of Polycarbonate Resin Film)

37.5 Parts by mass of isosorbide (ISB), 91.5 parts by mass of 9,9-[4-(2-hydroxyethoxyl)phenyl]fluorene (BHEPF), 8.4 parts by mass of polyethylene glycol (PEG) having an average molecular weight of 400, 105.7 parts by mass of diphenyl carbonate (DPC), and 0.594 part by mass of (a 0.2 mass % aqueous solution of) cesium carbonate as a catalyst were loaded into a reaction vessel. Under a nitrogen atmosphere, as a first step of a reaction, the heating medium temperature of the reaction vessel was set to 150° C., and the raw materials were dissolved while being stirred as required (for about 15 minutes).

Next, a pressure in the reaction vessel was increased from normal pressure to 13.3 kPa, and produced phenol was extracted to the outside of the reaction vessel while the heating medium temperature of the reaction vessel was increased to 190° C. in 1 hour.

A temperature in the reaction vessel was held at 190° C. for 15 minutes. After that, as a second step, the pressure in the reaction vessel was set to 6.67 kPa, the heating medium temperature of the reaction vessel was increased to 230° C. in 15 minutes, and the produced phenol was extracted to the outside of the reaction vessel. The temperature was increased to 250° C. in 8 minutes because the stirring torque of a stirring machine increased. In order for the produced phenol to be further removed, the pressure in the reaction vessel was reduced to 0.200 kPa or less. After the stirring torque had reached a predetermined value, the reaction was completed, and a produced reaction product was extruded into water and then pelletized. Thus, a polycarbonate resin A including structural units derived from dihydroxy compounds at a ratio "BHEPF/ISB/PEG" of 42.9 mol %/52.8 mol %/4.3 mol % was obtained.

The resultant polycarbonate resin A had a glass transition temperature of 126° C. and a reduced viscosity of 0.372 dL/g.

The resultant polycarbonate resin A was dried in a vacuum at 80° C. for 5 hours. After that, a polycarbonate resin film having a length of 3 m, a width of 300 mm, and a thickness of 120 μm was produced by using a film-producing apparatus including a uniaxial extruder (manufactured by Isuzu Kakoki, screw diameter: 25 mm, cylinder preset temperature: 220° C.), a T-die (width: 300 mm, preset temperature: 220° C.), a chill roll (preset temperature: 120 to 130° C.), and a rolling machine.

The resultant polycarbonate resin film had a water absorption rate of 1.2%.

(Production of first retardation layer)

The resultant polycarbonate resin film was cut into a piece measuring 300 mm long by 300 mm wide, and the piece was subjected to longitudinal stretching with Lab Stretcher KARO IV (manufactured by Bruckner) at a temperature of 136° C. and a ratio of 2 times to provide a retardation film.

The resultant retardation film had an Re(550) of 141 nm and an Rth(550) of 141 nm (nx: 1.5969, ny: 1.5942, nz: 1.5942), and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

20 Parts by weight of a side chain-type liquid crystal polymer represented by the following chemical formula (I) (numerical values "65" and "35" in the formula each represent the mole percent of a monomer unit, which is represented in the form of a block polymer for convenience: weight-average molecular weight: 5,000), 80 parts by weight of a polymerizable liquid crystal showing a nematic liquid crystal phase (manufactured by BASF: trade name "Paliocolor LC242"), and 5 parts by weight of a photopolymerization initiator (manufactured by Ciba Specialty Chemicals Inc.: trade name "IRGACURE 907") were dissolved in 200 parts by weight of cyclopentanone to prepare a liquid crystal application liquid. Then, the application liquid was applied to a base material film (norbornene-based resin film: manufactured by ZEON CORPORATION, trade name "ZEONEX") with a bar coater, and was then dried by heating at 80° C. for 4 minutes to align the liquid crystal. The liquid crystal layer was cured by irradiating the liquid crystal layer with UV light. Thus, a cured liquid crystal layer (thickness: 0.58 μm) serving as a second retardation layer was formed on the base material. The layer had an Re(550) of 0 nm and an Rth(550) of −71 nm (nx: 1.5326, ny: 1.5326, nz: 1.6550), and showed a refractive index characteristic of nz>nx=ny.

in an aqueous solution containing boric acid between rolls having different speeds at a stretching ratio of 6 times to provide a polarizer.

(Production of polarizing plate)

A triacetylcellulose film (thickness: 40 μm, manufactured by KONICA MINOLTA, INC., trade name "KC4UYW") was bonded to one side of the polarizer through a polyvinyl alcohol-based adhesive.

The retardation film was bonded to the other side of the polarizer through a polyvinyl alcohol-based adhesive. In this case, the bonding was performed so that the slow axis of the retardation film was at 45° counterclockwise with respect to the absorption axis of the polarizer. Next, the cured liquid crystal layer was bonded to the retardation film side through an acrylic pressure-sensitive adhesive, and then the base material film was removed. Thus, a polarizing plate was obtained.

(Production of organic EL panel)

A pressure-sensitive adhesive layer was formed by using an acrylic pressure-sensitive adhesive on the resultant polarizing plate on the cured liquid crystal layer (second retardation layer) side, and was cut into a piece having dimensions measuring 50 mm by 50 mm.

An organic EL panel was taken out of an organic EL display (manufactured by LG, product name "15EL9500"), a polarizing film attached to the organic EL panel was peeled, and the polarizing plate that had been cut out as described above was bonded thereto instead. Thus, an organic EL panel was obtained.

Table 1 shows the results of the measurement of the reflection hue of the organic EL panel. It should be noted that the column "viewing angle characteristic" in Table 1 shows a point-to-point distance Δxy between a reflection hue in a front direction and a reflection hue in an oblique direction (the maximum or minimum at a polar angle of 45°) on the xy chromaticity diagram of a CIE colorimetric system. In addition, the columns "change Δxy in front hue" and "change Δxy

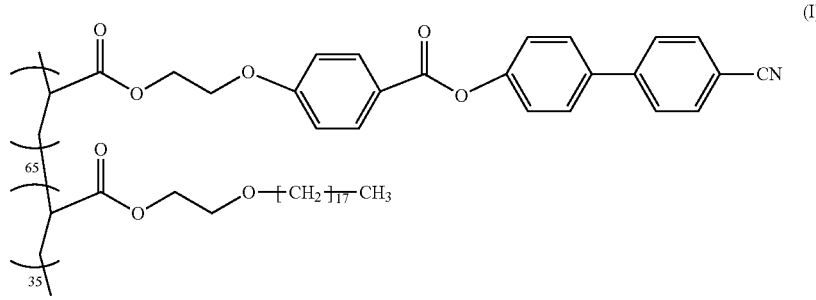

(I)

(Production of laminate)

The cured liquid crystal layer (second retardation layer) was bonded to the retardation film (first retardation layer) through an acrylic pressure-sensitive adhesive, followed by the removal of the base material film. Thus, a laminate in which the cured liquid crystal layer had been transferred onto the retardation film was obtained.

The resultant laminate had an Re(550) of 141 nm and an Rth(550) of 70 nm.

(Production of polarizer)

A polyvinyl alcohol film was dyed in an aqueous solution containing iodine. After that, the film was uniaxially stretched in oblique hue" each show a change in the reflection hue after introduction into an environmental test as compared to that before the introduction.

Example 2

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 1.85 times.

The resultant retardation film had an Re(550) of 120 nm and an Rth(550) of 120 nm (nx: 1.5967, ny: 1.5944, nz: 1.5944), and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 0.66 μm.

The resultant cured liquid crystal layer had an Re(550) of 0 nm and an Rth(550) of −80 nm (nx: 1.5339, ny: 1.5339, nz: 1.6551), and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 120 nm and an Rth(550) of 40 nm.

Example 3

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.1 times.

The resultant retardation film had an Re(550) of 160 nm and an Rth(550) of 160 nm (nx: 1.5971, ny: 1.5940, nz: 1.5940), and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 0.49 μm.

The resultant cured liquid crystal layer had an Re(550) of 0 nm and an Rth(550) of −60 nm (nx: 1.5325, ny: 1.5325, nz: 1.6549), and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 160 nm and an Rth(550) of 100 nm.

Example 4

An organic EL panel was produced in the same manner as in Example 1 except that the following retardation film (first retardation layer) was used.

Table 1 shows the results of the measurement of the reflection hue of the organic EL panel.

(First retardation layer)

A commercially available retardation film (manufactured by TEIJIN LIMITED, trade name "PURE-ACE WR (EWF)") was used without any treatment. The film had an Re(550) of 147 nm and an Rth(550) of 147 nm (nx: 1.5970, ny: 1.5942, nz: 1.5942), and showed a refractive index characteristic of nx>ny=nz. In addition, the resultant retardation film had a ratio "Re(450)/Re(550)" of 0.89. Further, the film had a water absorption rate of 0.5% and showed a retardation fluctuation by an environmental test of 5 nm.

(Production of laminate)

A laminate was obtained in the same manner as in Example 1 except that the retardation film described above was used.

The resultant laminate had an Re(550) of 147 nm and an Rth(550) of 76 nm.

Example 5

An organic EL panel was produced in the same manner as in Example 1 except that the following retardation film (first retardation layer) was used.

Table 1 shows the results of the measurement of the reflection hue of the organic EL panel.

(First retardation layer)

A polycarbonate resin B including structural units derived from dihydroxy compounds at a ratio "BHEPF/ISB/PEG (average molecular weight: 1,000)" of 45 mol %/51 mol %/4 mol % was obtained by a procedure in conformity with Example 1. The resultant polycarbonate resin B had a glass transition temperature of 134.1° C. A polycarbonate resin film was produced in the same manner as in Example 1 except that the polycarbonate resin B was used. The resultant polycarbonate resin film had a water absorption rate of 2.1%.

A retardation film (first retardation layer) was obtained in the same manner as in Example 1 except that: the polycarbonate resin film was used; and longitudinal stretching was performed at a stretching ratio of 1.5 times. The resultant retardation film had an Re(550) of 141 nm and an Rth(550) of 141 nm, and showed a refractive index characteristic of nx>ny=nz. In addition, the resultant retardation film had a ratio "Re(450)/Re(550)" of 0.98. Further, the film showed a retardation fluctuation by an environmental test of 5 nm.

(Production of laminate)

A laminate was obtained in the same manner as in Example 1 except that the retardation film described above was used.

The resultant laminate had an Re(550) of 141 nm and an Rth(550) of 70 nm.

Comparative Example 1

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(First retardation layer)

The cellulose ester film of Example 1 of JP 2005-42039 A (water absorption rate: 3.2%) was subjected to simultaneous biaxial stretching with Lab Stretcher KARO IV (manufactured by Bruckner) at a temperature of 100° C. and a ratio of 1.3 times to provide a retardation film.

The resultant retardation film had an Re(550) of 0 nm and an Rth(550) of 141 nm (nx: 1.4912, ny: 1.4912, nz: 1.4877), and showed a refractive index characteristic of nx=ny>nz. In addition, the film had a water absorption rate of 3.2% and showed a retardation fluctuation by an environmental test of 15 nm.

(Production of second retardation layer)

A liquid crystalline composition obtained by mixing 100 parts by weight of a liquid crystal compound [manufactured by Dainippon Ink and Chemicals, Inc., trade name "UCL-001"], 3 parts by weight of a photopolymerization initiator [manufactured by Ciba Specialty Chemicals Inc., trade name "IRGACURE 907"], and 0.05 part by weight of a leveling agent [manufactured by BYK-Chemie, trade name "BYK361"] was dissolved in 200 parts by weight of cyclopentanone (boiling point: 131° C.) to prepare a solution. Next, commercially available polyvinyl alcohol [manufactured by The Nippon Synthetic Chemical Industry Co., Ltd., trade name "NH-18"] was uniformly applied to the surface of a commercially available polyethylene terephthalate film [manufactured by Toray Industries, Inc., trade name "S-27E" (thickness: 75 μm)] in one direction with a rod coater, and was dried in an air-circulating thermostatic oven at 80° C.±1° C. for 5 minutes, followed by rubbing treatment with a cylindrical roller having attached thereto a rubbing cloth having a pile yarn of nylon (number of rotations: 1,000 r.p.m., indentation amount: 0.30 mm, moving speed: 60 mm/sec). Thus, an aligned base material was obtained. The prepared liquid crystal solution was applied to the surface of the resultant aligned base material with a rod coater, and was dried in an air-circulating thermostatic oven at 90° C.±1° C. for 3 minutes. After the application and drying, the dried product was cured by being irradiated with UV light. Thus, a cured layer of the liquid crystalline composition aligned in homogeneous alignment was formed.

The resultant cured layer had an Re550) of 141 nm and an Rth(550) of 141 nm (nx: 1.4916, ny: 1.4893, nz: 1.4893), and showed a refractive index characteristic of nx>ny=nz.

(Production of laminate)

A laminate was obtained in the same manner as in Example 1 except that the retardation film and cured liquid crystal layer described above were used.

The resultant laminate had an Re(550) of 141 nm and an Rth(550) of 282 nm.

Comparative Example 2

An organic EL panel was produced in the same manner as in Example 1 except that the second retardation layer was not used.

Table 1 shows the results of the measurement of the reflection hue of the organic EL panel.

Comparative Example 3

An organic EL panel was produced in the same manner as in Example 1 except that the following retardation film (first retardation layer) was used.

Table 1 shows the results of the measurement of the reflection hue of the organic EL panel.

(Production of first retardation layer)

5.0 Grams of PVA having a polymerization degree of 1,800 (The Nippon Synthetic Chemical Industry Co., Ltd., NH-18) dried at 105° C. for 2 hours were dissolved in 95 ml of DMSO. 3.78 Grams of mesitaldehyde, 1.81 g of propionaldehyde, and 1.77 g of p-toluenesulfonic acid monohydrate were added to the solution, and the mixture was stirred at 40° C. for 4 hours. The resultant was reprecipitated in a solution containing water and methanol at a ratio of 2/1 in which 2.35 g of sodium hydrogen carbonate had been dissolved. A polymer obtained by filtration was dissolved in THF and reprecipitated in diethyl ether. The resultant was filtered and dried. After that, 7.89 g of a white polymer were obtained.

The resultant polymer was subjected to measurement under the measurement conditions. As a result, a molar ratio among the respective sites of vinyl mesital, vinyl propional, and vinyl alcohol was 22:46:32, and a polymer of a structure represented by the following chemical formula (II) was obtained. In addition, the polymer had a glass transition temperature of 102° C. The resultant polymer was dissolved in DMF and formed into a film with an applicator. A film obtained by drying was stretched with a stretching machine at 110° C. and a stretching ratio of 1.8 times to provide a uniaxially stretched film having a thickness of 85 μm.

The resultant film had an Re(550) of 141 nm and an Rth (550) of 141 nm (nx: 1.5969, ny: 1.5942, nz: 1.5942), and showed a refractive index characteristic of nx>ny=nz. In addition, the resultant retardation film had a ratio "Re(450)/Re(550)" of 0.89. Further, the film had a water absorption rate of 4.9% and showed a retardation fluctuation by an environmental test of 20 nm.

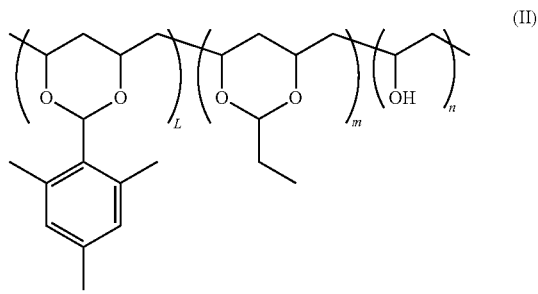

(II)

(Production of laminate)

A laminate was obtained in the same manner as in Example 1 except that the retardation film described above was used.

The resultant laminate had an Re(550) of 141 nm and an Rth(550) of 70 nm.

Comparative Example 4

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 1.82 times.

The resultant retardation film had an Re(550) of 115 nm and an Rth(550) of 115 nm (nx: 1.5966, ny: 1.5944, nz: 1.5944), and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 0.7 μm.

The resultant cured liquid crystal layer had an Re(550) of 0 nm and an Rth(550) of −85 nm (nx: 1.5338, ny: 1.5338, nz: 1.6552), and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 115 nm and an Rth(550) of 30 nm.

Comparative Example 5

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.13 times.

The resultant retardation film had an Re(550) of 170 nm and an Rth(550) of 170 nm (nx: 1.5972, ny: 1.5939, nz: 1.5939), and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 0.49 μm.

The resultant cured liquid crystal layer had an Re(550) of 0 nm and an Rth(550) of −60 nm (nx: 1.5325, ny: 1.5325, nz: 1.6549), and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 170 nm and an Rth(550) of 110 nm.

Example 6

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that the stretching ratio was set to 1.7 times.

The resultant retardation film had an Re(550) of 100 nm and an Rth(550) of 100 nm, and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

18 Kilograms of distilled water containing 0.2 wt % of partially saponified polyvinyl alcohol, 3 kg of diisopropyl fumarate, and 7 g of dimethyl-2,2'-azobisisobutyrate as a polymerization initiator were loaded into a 30-1 autoclave, and were subjected to a suspension radical polymerization reaction under the conditions of a polymerization temperature of 50° C. and a polymerization time of 24 hours. The resultant particles were filtered and then sufficiently washed with methanol, followed by drying at 80° C. Thus, a diisopropyl fumarate homopolymer was obtained. The resultant diisopropyl fumarate homopolymer was dissolved in a THF solution to prepare a 22% solution, and 0.35 part by weight of tris(2,4-di-t-butylphenyl)phosphite as a hindered phenol-based antioxidant and 0.15 part by weight of pentaerythritol-tetrakis(3-(3,5-di-t-butyl-4-hydroxyphenyl)propionate) as a phosphorus-based antioxidant, and 1 part by weight of 2-(2H-benzotriazol-2-yl)-p-cresol as a UV absorbing agent with respect to 100 parts by weight of the diisopropyl fumarate homopolymer were further added to the solution. After that, the resultant was cast onto the supporting substrate of a solution-casting apparatus by a T-die method, and was dried at 40° C., 80° C., and 120° C. for 15 minutes each. Thus, a film having a thickness of 20.7 μm was obtained.

The resultant film was cut into a piece measuring 300 mm long by 300 mm wide, and the piece was subjected to free-end longitudinal stretching with Lab Stretcher KARO IV (manufactured by Bruckner) at a temperature of 150° C. and a ratio of 1.05 times to provide a retardation film.

The resultant retardation film had an Re(550) of 20 nm and an Rth(550) of −60 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

Example 7

An organic EL panel was produced in the same manner as in Example 1 except that the following retardation films (first retardation layer and second retardation layer) were used.

Table 1 shows the results of the measurement of the reflection hue of the organic EL panel.

(First retardation layer)

The retardation film produced in Example 1 was used.

(Production of second retardation layer)

A retardation film was obtained in the same manner as in Example 6 except that the thickness was adjusted to 14.8 μm. The resultant retardation film had an Re(550) of 20 nm and an Rth(550) of −40 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 120 nm and an Rth(550) of 100 nm.

Example 8

An organic EL panel was produced in the same manner as in Example 1 except that the following retardation films (first retardation layer and second retardation layer) were used.

Table 1 shows the results of the measurement of the reflection hue of the organic EL panel.

(First retardation layer)

The retardation film produced in Example 1 was used.

(Production of second retardation layer)

A retardation film was obtained in the same manner as in Example 6 except that the thickness was adjusted to 14.8 μm.

The resultant retardation film had an Re(550) of 20 nm and an Rth(550) of −40 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 160 nm and an Rth(550) of 100 nm.

Example 9

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.2 times.

The resultant retardation film had an Re(550) of 170 nm and an Rth(550) of 170 nm, and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.025 times; and the thickness was set to 40 μm. The resultant retardation film had an Re(550) of 10 nm and an Rth(550) of −130 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 160 nm and an Rth(550) of 40 nm.

Example 10

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

The commercially available retardation film used in Example 4 was subjected to fixed-end stretching at a stretching temperature of 190° C. (MD stretching ratio: 0.85 times, TD stretching ratio: 1.1 times) to provide a retardation film for a first retardation layer.

The resultant retardation film had an Re(550) of 100 nm and an Rth(550) of 100 nm, and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Second retardation layer)

The retardation film produced in Example 6 was used.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

Example 11

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

The commercially available retardation film used in Example 4 was subjected to stretching at a stretching temperature of 190° C. and a stretching ratio of 1.2 times to provide a retardation film for a first retardation layer.

The resultant retardation film had an Re(550) of 170 nm and an Rth(550) of 170 nm, and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.025 times; and the thickness was set to 40 μm. The resultant retardation film had an Re(550) of 10 nm and an Rth(550) of −130 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 160 nm and an Rth(550) of 40 nm.

Comparative Example 6

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that the stretching ratio was set to 1.6 times.

The resultant retardation film had an Re(550) of 90 nm and an Rth(550) of 90 nm, and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Second retardation layer)

The retardation film produced in Example 6 was used.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 110 nm and an Rth(550) of 30 nm.

Comparative Example 7

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.3 times.

The resultant retardation film had an Re(550) of 180 nm and an Rth(550) of 180 nm, and showed a refractive index characteristic of nx>ny=nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.025 times; and the thickness was set to 40 μm. The resultant retardation film had an Re(550) of 10 nm and an Rth(550) of −130 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 170 nm and an Rth(550) of 50 nm.

Comparative Example 8

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Comparative Example 1 except that free-end stretching at a stretching ratio of 1.2 times was performed.

The resultant retardation film had an Re(550) of 100 nm and an Rth(550) of 100 nm, and showed a refractive index characteristic of nx>ny=nz. In addition, the resultant retardation film had a water absorption rate of 3.2% and showed a retardation fluctuation by an environmental test of 15 nm.

(Second retardation layer)

The retardation film produced in Example 6 was used.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

Comparative Example 9

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Comparative Example 3 except that the stretching ratio was set to 1.28 times.

The resultant retardation film had an Re(550) of 100 nm and an Rth(550) of 100 nm, and showed a refractive index characteristic of nx>ny=nz. In addition, the resultant retardation film had a water absorption rate of 4.9% and showed a retardation fluctuation by an environmental test of 20 nm.

(Second retardation layer)

The retardation film produced in Example 6 was used.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

Example 12

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.2 times.

The resultant retardation film had an Re(550) of 120 nm and an Rth(550) of 130 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 0.75 nm.

The resultant cured liquid crystal layer had an Re(550) of 0 nm and an Rth(550) of −90 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 120 nm and an Rth(550) of 40 nm.

Example 13

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(First retardation layer)

The retardation film produced in Example 12 was used.

(Production of second retardation layer)

A cured liquid crystal layer was obtained in the same manner as in Example 1 except that the thickness was adjusted to 0.25 μm.

The resultant cured liquid crystal layer had an Re(550) of 0 nm and an Rth(550) of −30 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 120 nm and an Rth(550) of 100 nm.

Example 14

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that free-end stretching at an MD stretching ratio of 3.2 times was performed and then fixed-end stretching at a TD stretching ratio of 1.5 times was performed.

The resultant retardation film had an Re(550) of 160 nm and an Rth(550) of 380 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 2.31 μm.

The resultant cured liquid crystal layer had an Re(550) of 0 nm and an Rth(550) of −280 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 160 nm and an Rth(550) of 100 nm.

Example 15

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.6 times.

The resultant retardation film had an Re(550) of 160 nm and an Rth(550) of 170 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 1.07 nm.

The resultant cured liquid crystal layer had an Re(550) of 0 nm and an Rth(550) of −130 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 160 nm and an Rth(550) of 40 nm.

Example 16

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

The commercially available retardation film used in Example 4 was subjected to simultaneous biaxial stretching at a stretching temperature of 190° C. (MD stretching ratio: 0.85 times, TD stretching ratio: 1.1 times), and was then subjected to fixed-end stretching (MD stretching ratio: 1.1 times) to provide a retardation film for a first retardation layer.

The resultant retardation film had an Re(550) of 120 nm and an Rth(550) of 130 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 4 except that the thickness was adjusted to 0.75 μm.

The resultant cured liquid crystal layer had an Re(550) of 0 nm and an Rth(550) of −90 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 120 nm and an Rth(550) of 40 nm.

Example 17

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

The commercially available retardation film used in Example 4 was subjected to fixed-end stretching at a stretching temperature of 190° C. (stretching ratio: 1.2 times) to provide a retardation film for a first retardation layer.

The resultant retardation film had an Re(550) of 160 nm and an Rth(550) of 170 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 4 except that the thickness was adjusted to 1.07 μm.

The resultant cured liquid crystal layer had an Re(550) of 0 nm and an Rth(550) of −130 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 160 nm and an Rth(550) of 40 nm.

Comparative Example 10

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.25 times.

The resultant retardation film had an Re(550) of 130 nm and an Rth(550) of 141 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 0.25 μm.

The resultant cured liquid crystal layer had an Re(550) of 0 nm and an Rth(550) of −30 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 130 nm and an Rth(550) of 111 nm.

Comparative Example 11

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Example 1 except that the stretching ratio was set to 2.5 times.

The resultant retardation film had an Re(550) of 150 nm and an Rth(550) of 181 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A cured liquid crystal layer was obtained in the same manner as in Example 1 except that the thickness was adjusted to 1.33 μm.

The resultant cured liquid crystal layer had an Re(550) of 0 nm and an Rth(550) of −160 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 150 nm and an Rth(550) of 21 nm.

Comparative Example 12

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Comparative Example 1 except that fixed-end stretching at an MD stretching ratio of 1.3 times was performed.

The resultant retardation film had an Re(550) of 120 nm and an Rth(550) of 130 nm, and showed a refractive index characteristic of nx>ny>nz. In addition, the resultant retardation film had a water absorption rate of 3.2% and showed a retardation fluctuation by an environmental test of 15 nm.

(Production of second retardation layer)

A cured liquid crystal layer was obtained in the same manner as in Comparative Example 1 except that the thickness was adjusted to 0.75 μm.

The resultant cured liquid crystal layer had an Re(550) of 0 nm and an Rth(550) of −90 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 120 nm and an Rth(550) of 40 nm.

Comparative Example 13

An organic EL panel was produced in the same manner as in Example 1 except that the following retardation film (first retardation layer) and cured liquid crystal layer (second retardation layer) were used.

Table 1 shows the results of the measurement of the reflection hue of the organic EL panel.

(Production of first retardation layer)

A retardation film was obtained in the same manner as in Comparative Example 3 except that fixed-end stretching at an MD stretching ratio of 2.3 times was performed.

The resultant retardation film had an Re(550) of 120 nm and an Rth(550) of 130 nm, and showed a refractive index characteristic of nx>ny>nz. In addition, the resultant retardation film had a water absorption rate of 4.9% and showed a retardation fluctuation by an environmental test of 20 nm.

(Production of second retardation layer)

A cured liquid crystal layer was obtained in the same manner as in Comparative Example 3 except that the thickness was adjusted to 0.75 μm.

The resultant cured liquid crystal layer had an Re(550) of 0 nm and an Rth(550) of −90 nm, and showed a refractive index characteristic of nz>nx=ny.

(Production of laminate)

A laminate was obtained in the same manner as in Example 1 except that the retardation film and cured liquid crystal layer described above were used.

The resultant laminate had an Re(550) of 120 nm and an Rth(550) of 40 nm.

Example 18

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that sequential biaxial stretching (fixed-end stretching at an MD stretching ratio of 1.6 times followed by lateral stretching at a TD stretching ratio of 1.26 times) was performed.

The resultant retardation film had an Re(550) of 40 nm and an Rth(550) of 100 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.2 times; and the thickness was set to 41 μm. The resultant retardation film had an Re(550) of 80 nm and an Rth(550) of −60 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

Example 19

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that sequential biaxial stretching (fixed-end stretching at an MD stretching ratio of 2.7 times followed by lateral stretching at a TD stretching ratio of 1.1 times) was performed.

The resultant retardation film had an Re(550) of 160 nm and an Rth(550) of 180 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.1 times; and the thickness was set to 35 μm. The resultant retardation film had an Re(550) of 40 nm and an Rth(550) of −80 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 120 nm and an Rth(550) of 100 nm.

Example 20

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that sequential biaxial stretching (fixed-end stretching at an MD stretching ratio of 1.65 times followed by lateral stretching at a TD stretching ratio of 1.31 times) was performed.

The resultant retardation film had an Re(550) of 40 nm and an Rth(550) of 120 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.3 times; and the thickness was set to 41 μm. The resultant retardation film had an Re(550) of 120 nm and an Rth(550) of −20 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 160 nm and an Rth(550) of 100 nm.

Example 21

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that fixed-end stretching at an MD stretching ratio of 2.75 times was performed.

The resultant retardation film had an Re(550) of 170 nm and an Rth(550) of 180 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.025 times; and the thickness was set to 45.5 μm. The resultant retardation film had an Re(550) of 10 nm and an Rth(550) of −140 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 160 nm and an Rth(550) of 40 nm.

Example 22

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

The commercially available retardation film used in Example 4 was subjected to simultaneous biaxial stretching at a stretching temperature of 190° C. (MD stretching ratio: 0.85 times, TD stretching ratio: 1.2 times) to provide a retardation film for a first retardation layer.

The resultant retardation film had an Re(550) of 40 nm and an Rth(550) of 100 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Second retardation layer)

The retardation film produced in Example 18 was used.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

Example 23

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

The commercially available retardation film used in Example 4 was subjected to fixed-end stretching at a stretching ratio of 1.25 times to provide a retardation film for a first retardation layer.

The resultant retardation film had an Re(550) of 170 nm and an Rth(550) of 180 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Second retardation layer)

The retardation film produced in Example 21 was used.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 160 nm and an Rth(550) of 40 nm.

Comparative Example 14

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that sequential biaxial stretching (fixed-end stretching at an MD stretching ratio of 1.65 times followed by lateral stretching at a TD stretching ratio of 1.3 times) was performed.

The resultant retardation film had an Re(550) of 50 nm and an Rth(550) of 125 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.2 times; and the thickness was set to 50 μm. The resultant retardation film had an Re(550) of 80 nm and an Rth(550) of −90 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 130 nm and an Rth(550) of 35 nm.

Comparative Example 15

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Example 1 except that fixed-end stretching at an MD stretching ratio of 2.8 times was performed.

The resultant retardation film had an Re(550) of 180 nm and an Rth(550) of 190 nm, and showed a refractive index characteristic of nx>ny>nz. In addition, the resultant retardation film had a ratio "Re(450)/Re(550)" of 0.89. Further, the film showed a retardation fluctuation by an environmental test of 5 nm.

(Production of second retardation layer)

A retardation film was obtained in the same manner as in Example 6 except that: the stretching ratio was set to 1.025 times; and the thickness was set to 26.6 μm. The resultant retardation film had an Re(550) of 10 nm and an Rth(550) of −80 nm, and showed a refractive index characteristic of nz>nx>ny.

(Production of laminate)

A laminate was obtained in the same manner as in Example 1 except that: the respective retardation films described above were used; and the films were arranged so that the slow axis of the first retardation layer and the slow axis of the second retardation layer were substantially perpendicular to each other.

The resultant laminate had an Re(550) of 170 nm and an Rth(550) of 110 nm.

Comparative Example 16

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Comparative Example 1 except that sequential biaxial stretching (free-end stretching at an MD stretching ratio of 1.18 times followed by lateral stretching at a TD stretching ratio of 1.08 times) was performed.

The resultant retardation film had an Re(550) of 40 nm and an Rth(550) of 100 nm, and showed a refractive index characteristic of nx>ny>nz. In addition, the resultant retardation film had a water absorption rate of 3.2% and showed a retardation fluctuation by an environmental test of 15 nm.

(Second retardation layer)

The retardation film produced in Example 18 was used.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

Comparative Example 17

An organic EL panel was produced in the same manner as in Example 1 except that the following retardation films (first retardation layer and second retardation layer) were used.

Table 1 shows the results of the measurement of the reflection hue of the organic EL panel.

(Production of first retardation layer)

A retardation film was obtained in the same manner as in Comparative Example 3 except that sequential biaxial stretching (fixed-end stretching at an MD stretching ratio of 1.96 times followed by lateral stretching at a TD stretching ratio of 1.37 times) was performed.

The resultant retardation film had an Re(550) of 40 nm and an Rth(550) of 100 nm, and showed a refractive index characteristic of nx>ny>nz. In addition, the resultant retardation film had a water absorption rate of 4.9% and showed a retardation fluctuation by an environmental test of 20 nm.

(Second retardation layer)

The retardation film produced in Example 18 was used.

(Production of laminate)

A laminate was obtained in the same manner as in Example 1 except that: the respective retardation films described above were used; and the films were arranged so that the slow axis of the first retardation layer and the slow axis of the second retardation layer were substantially parallel to each other.

The resultant laminate had an Re(550) of 120 nm and an Rth(550) of 40 nm.

TABLE 1

| | First retardation layer | | | Second retardation layer | | | Change | Change |
|---|---|---|---|---|---|---|---|---|
| | Refractive index characteristic | Retardation fluctuation | Water absorption rate | Refractive index characteristic | Laminate Re/Rth | Viewing angle characteristic | Δ xy in front hue | Δ xy in oblique hue |
| Example 1 | nx > ny = nz | 5 nm | 1.2% | nz > nx = ny | 141/70 | 0.014 | 0.034 | 0.025 |
| Example 2 | nx > ny = nz | 5 nm | 1.2% | nz > nx = ny | 120/40 | 0.051 | 0.064 | 0.069 |
| Example 3 | nx > ny = nz | 5 nm | 1.2% | nz > nx = ny | 160/100 | 0.017 | 0.052 | 0.024 |
| Example 4 | nx > ny = nz | 5 nm | 0.5% | nz > nx = ny | 147/76 | 0.014 | 0.034 | 0.025 |
| Example 5 | nx > ny = nz | 5 nm | 2.1% | nz > nx = ny | 141/70 | 0.014 | 0.034 | 0.025 |
| Comparative Example 1 | nx = ny > nz | 15 nm | 3.2% | nx > ny = nz | 141/282 | 0.368 | 0.034 | 0.146 |
| Comparative Example 2 | nx > ny = nz | 5 nm | 1.2% | None | 141/141 | 0.229 | 0.034 | 0.223 |
| Comparative Example 3 | nx > ny = nz | 20 nm | 4.9% | nz > nx = ny | 141/70 | 0.014 | 0.453 | 0.222 |
| Comparative Example 4 | nx > ny = nz | 5 nm | 1.2% | nz > nx = ny | 115/30 | 0.072 | 0.314 | 0.118 |
| Comparative Example 5 | nx > ny = nz | 5 nm | 1.2% | nz > nx = ny | 170/110 | 0.072 | 0.361 | 0.141 |
| Example 6 | nx > ny = nz | 5 nm | 1.2% | nz > nx > ny | 120/40 | 0.065 | 0.064 | 0.069 |
| Example 7 | nx > ny = nz | 5 nm | 1.2% | nz > nx > ny | 120/100 | 0.049 | 0.064 | 0.053 |
| Example 8 | nx > ny = nz | 5 nm | 1.2% | nz > nx > ny | 160/100 | 0.051 | 0.052 | 0.024 |
| Example 9 | nx > ny = nz | 5 nm | 1.2% | nz > nx > ny | 160/40 | 0.058 | 0.052 | 0.053 |
| Example 10 | nx > ny = nz | 5 nm | 0.5% | nz > nx > ny | 120/40 | 0.065 | 0.064 | 0.069 |
| Example 11 | nx > ny > nz | 5 nm | 0.5% | nz > nx > ny | 160/40 | 0.058 | 0.052 | 0.053 |
| Comparative Example 6 | nx > ny = nz | 5 nm | 1.2% | nz > nx > ny | 110/30 | 0.182 | 0.341 | 0.108 |
| Comparative Example 7 | nx > ny = nz | 5 nm | 1.2% | nz > nx > ny | 170/50 | 0.126 | 0.325 | 0.125 |
| Comparative Example 8 | nx > ny = nz | 15 nm | 3.2% | nz > nx > ny | 120/40 | 0.065 | 0.463 | 0.182 |
| Comparative Example 9 | nx = ny > nz | 20 nm | 4.9% | nz > nx > ny | 120/40 | 0.065 | 0.681 | 0.228 |

TABLE 2

| | First retardation layer | | | Second retardation layer | | | Change Δ xy in front hue | Change Δ xy in oblique hue |
|---|---|---|---|---|---|---|---|---|
| | Refractive index characteristic | Retardation fluctuation | Water absorption rate | Refractive index characteristic | Laminate Re/Rth | Viewing angle characteristic | | |
| Example 12 | nx > ny > nz | 5 nm | 1.2% | nz > nx = ny | 120/40 | 0.047 | 0.064 | 0.069 |
| Example 13 | nx > ny > nz | 5 nm | 1.2% | nz > nx = ny | 120/100 | 0.043 | 0.064 | 0.053 |
| Example 14 | nx > ny > nz | 5 nm | 1.2% | nz > nx = ny | 160/100 | 0.065 | 0.052 | 0.024 |
| Example 15 | nx > ny > nz | 5 nm | 1.2% | nz > nx = ny | 160/40 | 0.061 | 0.052 | 0.053 |
| Example 16 | nx > ny > nz | 5 nm | 0.5% | nz > nx = ny | 120/40 | 0.047 | 0.064 | 0.069 |
| Example 17 | nx > ny > nz | 5 nm | 0.5% | nz > nx = ny | 160/40 | 0.061 | 0.052 | 0.053 |
| Comparative Example 10 | nx > ny > nz | 5 nm | 1.2% | nz > nx = ny | 130/111 | 0.293 | 0.148 | 0.148 |
| Comparative Example 11 | nx > ny > nz | 5 nm | 1.2% | nz > nx = ny | 150/21 | 0.310 | 0.059 | 0.155 |
| Comparative Example 12 | nx > ny > nz | 15 nm | 3.2% | nz > nx = ny | 120/40 | 0.047 | 0.128 | 0.138 |
| Comparative Example 13 | nx > ny > nz | 20 nm | 4.9% | nz > nx = ny | 120/40 | 0.047 | 0.364 | 0.372 |
| Example 18 | nx > ny > nz | 5 nm | 1.2% | nz > nx > ny | 120/40 | 0.063 | 0.064 | 0.069 |
| Example 19 | nx > ny > nz | 5 nm | 1.2% | nz > nx > ny | 120/100 | 0.060 | 0.064 | 0.053 |
| Example 20 | nx > ny > nz | 5 nm | 1.2% | nz > nx > ny | 160/100 | 0.064 | 0.052 | 0.024 |
| Example 21 | nx > ny > nz | 5 nm | 1.2% | nz > nx > ny | 160/40 | 0.063 | 0.052 | 0.053 |
| Example 22 | nx > ny > nz | 5 nm | 0.5% | nz > nx > ny | 120/40 | 0.063 | 0.064 | 0.069 |
| Example 23 | nx > ny > nz | 5 nm | 0.5% | nz > nx > ny | 160/40 | 0.063 | 0.052 | 0.053 |
| Comparative Example 14 | nx > ny > nz | 5 nm | 1.2% | nz > nx > ny | 130/35 | 0.330 | 0.077 | 0.155 |
| Comparative Example 15 | nx > ny > nz | 5 nm | 1.2% | nz > nx > ny | 170/110 | 0.329 | 0.066 | 0.072 |
| Comparative Example 16 | nx > ny > nz | 15 nm | 3.2% | nz > nx > ny | 120/40 | 0.063 | 0.128 | 0.138 |
| Comparative Example 17 | nx > ny > nz | 20 nm | 4.9% | nz > nx > ny | 120/40 | 0.063 | 0.252 | 0.372 |

In each of Examples, the viewing angle characteristic was good because the characteristic was less than 0.07, and the hue change Δxy in each of the front and oblique directions was also good because the change was less than 0.07. In each of Comparative Examples in which the water absorption rate of the first retardation layer, or the Re(550) or Rth(550) of the laminate of the first retardation layer and the second retardation layer deviated from the range of the present invention, at least one of the viewing angle characteristic, the change Δxy in front hue, and the change Δxy in oblique hue was insufficient.

Industrial Applicability

The polarizing plate of the present invention is suitably used in an organic EL device.

Reference Signs List 10 polarizer
20 protective film
21 first protective film
22 second protective film
30 first retardation layer
40 second retardation layer
100 polarizing plate
100' polarizing plate

The invention claimed is:

1. A polarizing plate for an organic EL panel, comprising:
a polarizer,
a first retardation layer; and
a second retardation layer,
wherein:
the first retardation layer shows a refractive index characteristic of nx>ny≥nz and satisfies a relationship of Re(450)<Re(550);
the second retardation layer shows a refractive index characteristic of nz>nx≥ny;
an angle θ formed between an absorption axis of the polarizer and a slow axis of the first retardation layer satisfies a relationship of 35°≤θ≤55°;
a laminate of the first retardation layer and the second retardation layer has an Re(550) of from 120 nm to 160 nm and an Rth(550) of from 40 nm to 100 nm;
the first retardation layer has a water absorption rate of 3% or less;
where Re(450) represents an in-plane retardation measured at 23° C. with light having a wavelength of 450 nm, Re(550) represents an in-plane retardation measured at 23° C. with light having a wavelength of 550 nm, and Rth(550) represents a thickness direction retardation measured at 23° C. with the light having a wavelength of 550 nm.

2. A polarizing plate according to claim 1, wherein the polarizing plate is free of an optically anisotropic layer between the polarizer and the first retardation layer or the second retardation layer.

3. A polarizing plate according to claim 1, wherein the first retardation layer is formed of a polycarbonate resin including a structural unit derived from a dihydroxy compound represented by the following general formula (1):

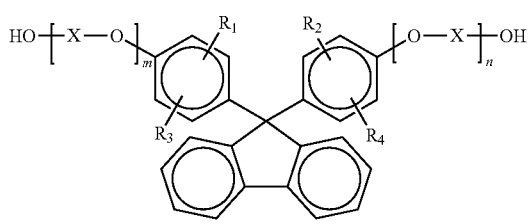

(1)

in the general formula (1), $R_1$ to $R_4$ each independently represent a hydrogen atom, a substituted or unsubstituted alkyl group having 1 to 20 carbon atoms, a substituted or unsubstituted cycloalkyl group having 6 to 20 carbon atoms, or a substituted or unsubstituted aryl group having 6 to 20 carbon atoms, X represents a substituted or unsubstituted alkylene group having 2 to 10 carbon atoms, a substituted or unsubstituted cycloalkylene group having 6 to 20 carbon atoms, or a substituted or unsubstituted arylene group having 6 to 20 carbon atoms, and m and n each independently represent an integer of from 0 to 5.

4. A polarizing plate according to claim 3, wherein the first retardation layer is formed of a polycarbonate resin including a structural unit derived from a dihydroxy compound represented by the following general formula (2).

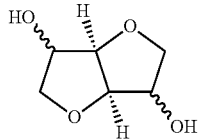

(2)

5. A polarizing plate according to claim 4, wherein the first retardation layer is formed of a polycarbonate resin including a structural unit derived from a dihydroxy compound represented by the following general formula (5):

$$H-(O-R_7)_p-OH \tag{5}$$

in the general formula (5), $R_7$ represents a substituted or unsubstituted alkylene group having 2 to 10 carbon atoms, and p represents an integer of from 2 to 100.

6. A polarizing plate according to claim 1, wherein the first retardation layer comprises a retardation film obtained by oblique stretching.

7. An organic EL panel, comprising the polarizing plate according to claim 1.

* * * * *